United States Patent
Ostmann et al.

(10) Patent No.: US 8,042,724 B2
(45) Date of Patent: Oct. 25, 2011

(54) METHOD FOR ELECTRICALLY CONNECTING TO A CONTACT OF A MICROELECTRONIC COMPONENT ON A CIRCUIT BOARD OR SUBSTRATE

(75) Inventors: Andreas Ostmann, Berlin (DE); Alexander Neumann, Berlin (DE); Dionysios Manessis, Berlin (DE); Rainer Patzelt, Berlin (DE)

(73) Assignees: Fraunhofer-Gesellschaft zur Foerderung der angewandten Forschung e.V., Munich (DE); Technische Universitaet Berlin, Berlin (DE)

( * ) Notice: Subject to any disclaimer, the term of this patent is extended or adjusted under 35 U.S.C. 154(b) by 378 days.

(21) Appl. No.: 11/882,824

(22) Filed: Aug. 6, 2007

(65) Prior Publication Data
US 2008/0061115 A1    Mar. 13, 2008

(30) Foreign Application Priority Data
Aug. 5, 2006    (DE) .................. 10 2006 036 728

(51) Int. Cl.
*B23K 31/00*    (2006.01)
*H01L 21/44*    (2006.01)

(52) U.S. Cl. .............. 228/180.22; 228/180.21; 438/612; 438/613

(58) Field of Classification Search ............. 228/180.22, 228/180.21; 438/612–613
See application file for complete search history.

(56) References Cited

U.S. PATENT DOCUMENTS

| | | | | |
|---|---|---|---|---|
| 5,865,934 A | * | 2/1999 | Yamamoto et al. | 156/295 |
| 5,875,100 A | * | 2/1999 | Yamashita | 361/764 |
| 6,410,415 B1 | * | 6/2002 | Estes et al. | 438/612 |
| 6,767,761 B2 | * | 7/2004 | Honda | 438/108 |
| 6,780,668 B1 | | 8/2004 | Tsukahara et al. | |
| 6,975,036 B2 | * | 12/2005 | Ohuchi | 257/778 |
| 2002/0048847 A1 | | 4/2002 | Tsunoi et al. | |

FOREIGN PATENT DOCUMENTS

| | | | |
|---|---|---|---|
| EP | 1 104 017 A2 | | 5/2001 |
| EP | 1 448 034 A1 | | 8/2004 |
| JP | 06204651 A | * | 7/1994 |
| JP | 09172021 A | | 6/1997 |

OTHER PUBLICATIONS

Loeher et al., "Smart PCBs Manufacturing Technologies", 6th International Conference on Electronics Packaging Technology, China, Aug. 30-Sep. 2, 2005.*
German Office Action dated Apr. 20, 2007 issued on priority Application No. 10 2006 036 728.6.

* cited by examiner

*Primary Examiner* — Jessica L Ward
*Assistant Examiner* — Devang R Patel
(74) *Attorney, Agent, or Firm* — Venable LLP; Robert Kinberg; Christopher Ma

(57) ABSTRACT

A method is provided for making an electrical connection with a microelectronic component arranged on or embedded within a surface of a circuit board layer or a substrate. The microelectronic component has an electrical contact face that is accessible on a surface of the microelectronic component. An electrically conducting bump is applied to the electrical contact face of the microelectronic component. A metal foil or metal coat is applied via a coating of an insulating binder to the surface of the circuit board under an action of pressure and/or heat so that the electrically conducting bump penetrates the coating of the insulating binder to make the electrical connection between the metal foil or metal coat and the electrical contact face.

20 Claims, 3 Drawing Sheets

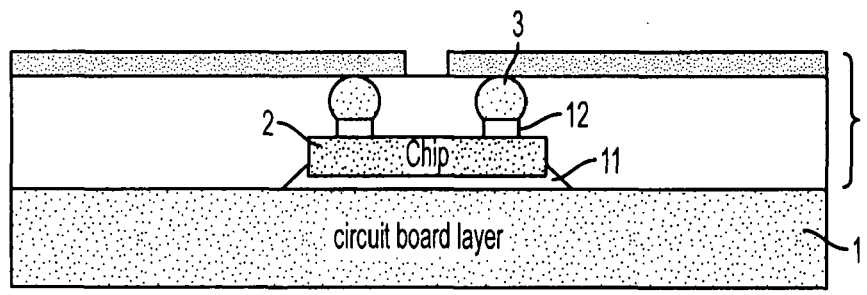
Fig. 9
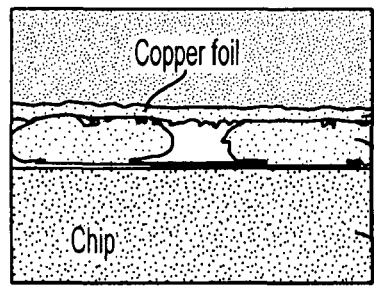 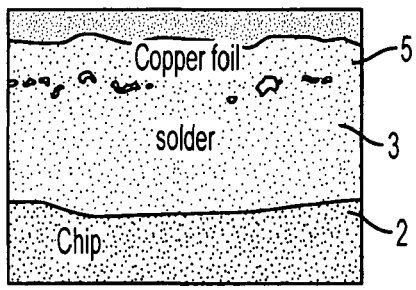
Fig. 10a  Fig. 10b
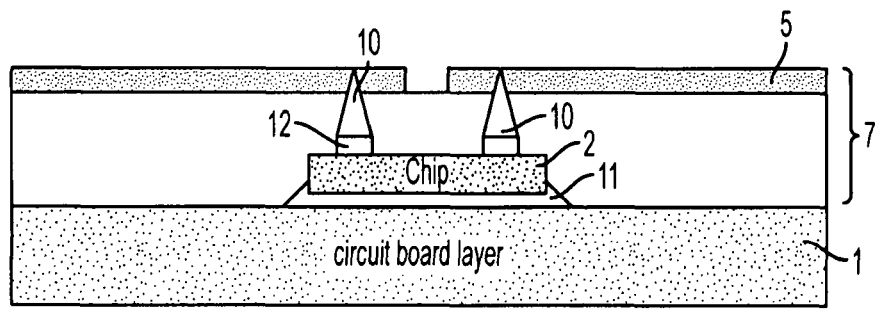
Fig. 11
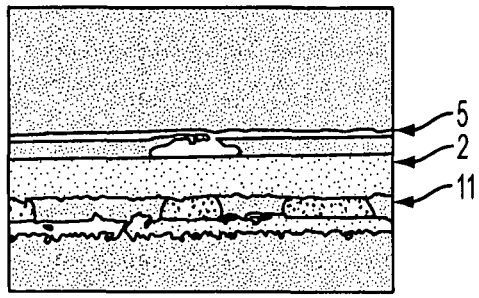 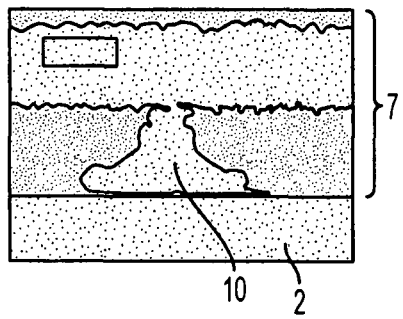
Fig. 12a  Fig. 12b

METHOD FOR ELECTRICALLY CONNECTING TO A CONTACT OF A MICROELECTRONIC COMPONENT ON A CIRCUIT BOARD OR SUBSTRATE

CROSS-REFERENCE TO RELATED APPLICATION

This application claims the priority of German Patent Application No: 10 2006 036 728.6, filed on Aug. 5, 2006, the subject matter of which is incorporated herein by reference.

BACKGROUND OF THE INVENTION

1. Field of Invention

The present invention relates generally semiconductor circuits, and more particularly to making an electrical connection to a contact of a microelectronic component on substrate or a circuit board.

2. Description of the Related Art

The integration of semiconductor components in circuit boards is assuming ever-increasing importance in the further development of circuit board production techniques.

For the production of highly integrated circuit boards, microelectronic components, such as semiconductor chips, SMD resistors, or SMD capacitors, are integrated in individual layers of circuit boards to increase the functionality of the circuit board. When integrating a semiconductor chip on a circuit board, the semiconductor chip is glued on a layer of the circuit board via, for example, a printed-on adhesive or an adhesive tape. The chip is then buried with an Resin Coated Copper (RCC) laminate, a layer of epoxy that is not fully cross-linked, and a copper foil. After lamination, the chip is covered by the epoxy of the RCC laminate. A space, which is also filled by the epoxy of the RCC laminate, separates the chip contacts and the copper foil. The copper foil and the epoxy over the chip contacts are then removed using a laser drilling machine and the micro holes thereby produced are filled using a current-less and/or galvanic metallization technique. After the electrical connection is made between the electric contacts of the chip and the copper foil, the copper foil is structured for producing printed board circuit tracks.

The depth of the micro holes produced with the laser drilling machine depends on the laminating parameters, the thickness of the semiconductor chip, and the thickness of the epoxy coat. This dependence means that the diameters of the micro holes do not drop below 50 µm at a depth of 25 to 50 µm. If the aspect ratio (ratio of diameter to depth) of the holes is undesirable, in particular less than 1:2, the metallization baths used may no longer adequately flow in and out of the holes and the metallization may be defective.

The copper foil is generally also strengthened during metallization. During the subsequent structuring of the copper foil into circuit tracks, this strengthening process has a negative influence on the width of the circuit tracks structure. the sub-surface etching, which affects the structure width, increases with the coat thickness. Hence, the thicker the copper coat, the larger the structures to be produced.

With the ever-increasing reduction in contact center-to-center distances (pitch) of the semiconductor chips, the limitations of the conventional micro-hole technology become more and more apparent. If the distance between two contacts on the chip becomes too small, the micro holes can no longer be produced while keeping adequate insulating distance between the contacts. This results in short-circuits between the contacts, rendering the product unusable. Problems using the conventional micro hole diameters, problems have already been arising at a pitch of less than 120 µm.

What is needed is a method for the electrical contacting of one or a plurality of microelectronic components on a substrate or a circuit board that avoids the disadvantages associated with the micro holes and can be implemented at low cost.

SUMMARY OF THE INVENTION

According to an embodiment of the present invention, a method is provided for making an electrical connection with a microelectronic component arranged on or embedded within a surface of a circuit board layer, the microelectronic component having an electrical contact face accessible on a surface of the microelectronic component, the method including applying an electrically conducting bump to the electrical contact face of the microelectronic component; and applying a metal foil or metal coat via a coating of an insulating binder to the surface of the circuit board under an action of pressure and/or heat so that the electrically conducting bump penetrates the coating of the insulating binder to make the electrical connection between the metal foil or metal coat and the electrical contact face.

According to another embodiment of the present invention, a method is provided for making an electrical connection with a microelectronic component arranged on or embedded within a substrate of a semiconductor chip, the microelectronic component having an electrical contact face accessible on a surface of the microelectronic component, the method including applying an electrically conducting bump to the electrical contact face of the microelectronic component; and applying a metal foil or metal coat via a coating of an insulating binder to the surface of the substrate under an action of pressure and/or heat so that the electrically conducting bump penetrates the coating of the insulating binder to make the electrical connection between the metal foil or metal coat and the electrical contact face.

In embodiments of the invention, the metal foil or the metal coat is connected via the electrically insulating binder to the surface of the substrate and an electrical connection is produced between the metal foil or metal coat and the electrical contacts of the microelectronic components. In one embodiment, the metal foil or metal coat is not applied to a substrate, i.e., it is separate or loose, or is only connected to a coat or layer of the insulating binder, e.g., in the form of an RCC laminate. The electrical, contacting is achieved by applying electrically conducting contacting bumps on the electrical contacts of the microelectronic components before connection to the metal foil or metal coat. As the metal foil or metal coat is pressed towards the substrate, the bumps penetrate the coat formed by the binder and make an electrical connection between the metal foil or the metal coat and the electrical contacts. In one embodiment, heat is also applied to the binder. The application of the electrically conducting contacting bumps, according to an embodiment, may take place before the microelectronic components are applied to the substrate or after the application or integration of these components to or in the substrate.

According to an embodiment of the invention, the electrical connection between the contacts of the microelectronic components, such as semiconductor chips or SMD components, and the metal foil or metal coat is achieved purely mechanically or via a soldered joint. In the case of a purely mechanical connection, the contact bumps are designed so that they form a shape that tapers upwards or has a plurality of studs, so that when the metal foil or metal coat is pressed on, the bumps penetrate the metal foil or metal coat. During the production of a soldered joint, the contacting bumps are selected from a solder which softens when the temperature rises, as is often necessary for producing the binding action of the binder, and attaches to the underside of the metal foil or metal coat. A thermoplastic or a duromer may be used as a binding agent. The melting point of the solder of the contact bump is set slightly higher than the setting temperature of the duromer. As a result, the laminating process alone also achieves the soldered joint between the metal foil and the contacts of the microelectronic components.

According to embodiments of the invention, the drilling of micro holes and their filling with an electrically conducting material is no longer required. The connection between the metal coat or metal foil and the electrical contacts of the microelectronic components is replaced by a soldered joint or a pressure contact. The method may be implemented at a lower cost, since there is no need for a laser drilling machine or the subsequent metallization of the micro holes. The strengthening of the metal coat or metal foil that often occurs in the metallization of the micro holes does not arise here, so that during the subsequent structuring, smaller structures can be etched from the coat. Thus, embodiments of the invention also allows smaller the contact center to center, since there are no limitations due to the production of the micro holes.

The electrically conducting contact bumps may be formed from different materials. For example, solder (even in the case of a purely mechanical connection), gold (e.g. au stud bumps), copper, nickel, or a mixture of nickel and diamond may be used as bumps. The metal foil or metal coat may be selected from copper. The connection of this metal foil or metal coat to the surface of the substrate may be achieved using various conventional methods. The binder may either be applied to the metal foil or metal coat and press on the substrate along with the metal foil or metal coat, or may alternatively be arranged on the substrate before the metal foil or metal coat is pressed towards the substrate. Conventional RCC laminate may be used in the binder.

In a further embodiment of the invention, a metal foil with a printed-on polymer is structured on the metal foil. Due to the structuring, the points on the metal foil which are to come into contact with the contact bumps are laid open and only the remaining points are covered with polymer or binder, which simplifies the contacting process since the contact bumps need not first penetrate the polymer material. Alternatively, a structured binder coat is applied to the substrate separately from the metal foil and the points at which contact bumps exist are released. The metal foil is then connected by the binder applied to the substrate during the connection process under the influence of pressure and temperature.

BRIEF DESCRIPTION OF THE DRAWINGS

These and other features and advantages of the invention will be further understood from the following detailed description of an embodiment of the invention with reference to the accompanying drawings.

FIG. 9 shows an example of a buried semiconductor chip connected by a solder.

FIGS. 10a-10b show two light-microscopic photographs of the connection according to FIG. 9.

FIG. 11 shows an example of a buried semiconductor chip connected via studded contact bumps.

FIGS. 12a-12b show light-microscopic images of the connection shown in FIG. 11.

DETAILED DESCRIPTION

Figure 1:
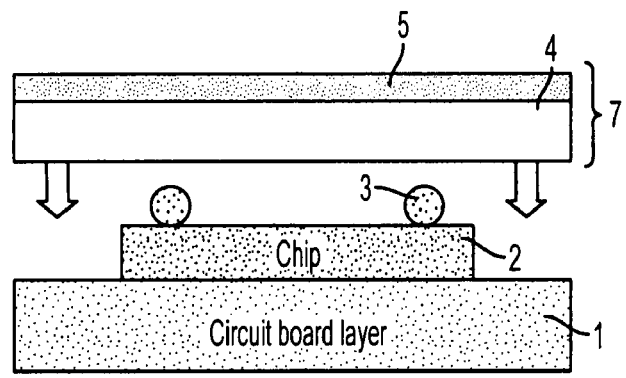
FIG. 1 depicts a cross-sectional view of a design according to a first embodiment of the invention.

FIG. 1 shows a cross-sectional view a semiconductor chip 2 having contacts that are to be electrically connected, arranged on a circuit board layer 1 is to be contacted, according to a first embodiment of the invention. According to this embodiment, the lower side of the semiconductor chip 2 is connected via an adhesive coat, not shown in the figure, to the surface of circuit board layer 1. The contacts of semiconductor chip 2 are arranged on the upper surface of semiconductor chip 2 opposite the lower surface facing the circuit board layer 1.

According to this embodiment, before semiconductor chip 2 is glued to circuit board layer 1, a soldered bump 3 is arranged on the electrical contacts of the semiconductor chip 2 using conventional methods such as, e.g., template printing or dip soldering. In one embodiment, soldering material with a melting temperature of 220° may be used for the soldered bump 3. FIG. 1 shows the structure after semiconductor chip 2 is connected to circuit board layer 1, the projecting soldering bumps 3 arranged visibly on the upper surface of the semiconductor chip 2. Next, a layer of RCC laminate 7, composed of a copper foil 5 and a polymer coat 4, is laminated onto the surface of circuit board layer 1 and the semiconductor chip 2. In one embodiment, the laminating process is carried out at a temperature of 200° C., as a result of which the polymer 4 of laminate 7 softens and flows around the semiconductor chip 2, as well as the soldering bump 3. As the soldering bump 3 is pushed through the softening polymer 4, the temperature increases, causing the soldering bump 3 to become soft or liquid and connect to the underside of copper foil 5. Thereafter, the structure is once again cooled down, causing the solder to solidify and create an electrical connection between the contacts of semiconductor chip 2 and copper foil 5 of laminate 7.

Figure 2:
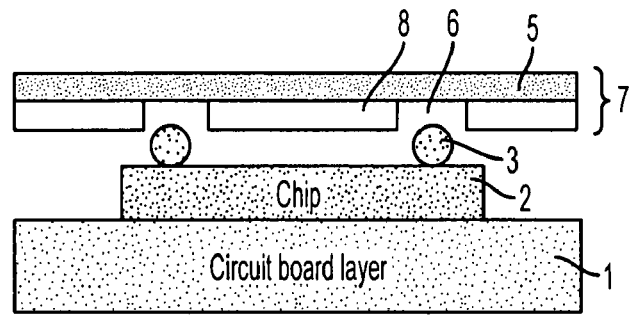
FIG. 2 depicts a cross-sectional view of a design according to a second embodiment of the invention.

FIG. 2 shows a cross-sectional view of a design according to a further embodiment of the invention, in which, unlike the design shown in FIG. 1, a polymer coat 8 is arranged on copper foil 5. Here, the polymer coat 8 initially applied to the whole surface is structured before the lamination process so that points 6 at which the copper foil 5 is to connect to the soldering bumps 3 are left uncovered or are only covered by a layer polymer coat that is thinner than the other regions. In this embodiment, soldering bumps 3 need penetrate no material coat or only a very thin layer of material coat during the connection process.

Figure 3:
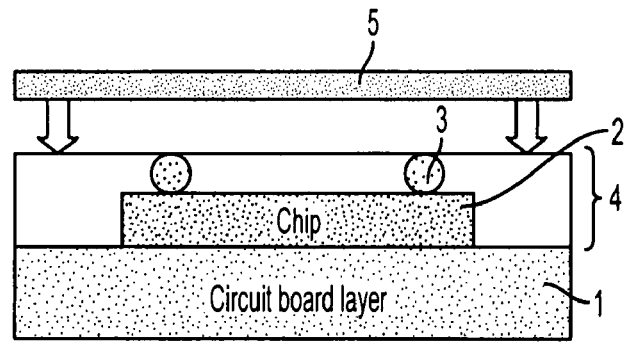
FIG. 3 depicts a cross-sectional view of a design according to a third embodiment of the invention.

In a further embodiment of this process, as shown in FIG. 3, the polymer coat 4 and copper foil 5 are applied separately. In this embodiment, the connection between copper foil 5 and the soldering bumps 3 is made, similar to the previous embodiments, by the application of pressure and temperature during the laminating process.

Figure 4:
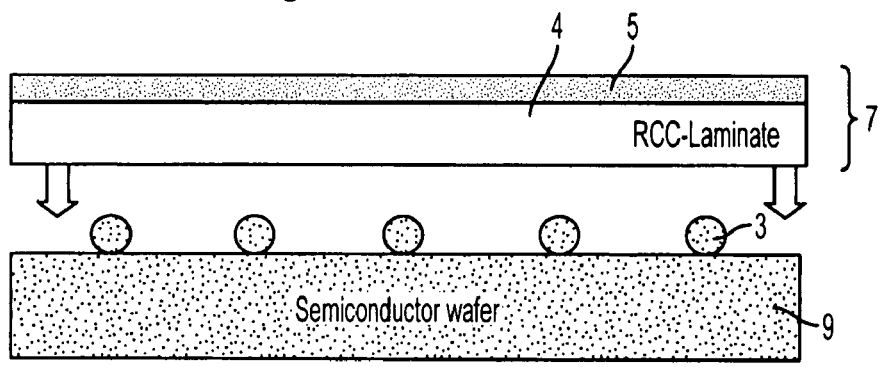
FIG. 4 depicts a cross-sectional view of a design according to a fourth embodiment of the invention.

FIG. 4 shows a cross-sectional view of a design according to another embodiment of the invention in which the substrate is a semiconductor wafer 9 in which the semiconductor chips are integrated. In this embodiment, the soldering bumps 3 are first applied to the overlaying contacts of the semiconductor chips, as explained in reference to the previous embodiments. The process of connecting the contacts to a copper foil 5 is then carried out by laminating an RCC laminate 7 onto it, as previously discussed.

Figure 5:
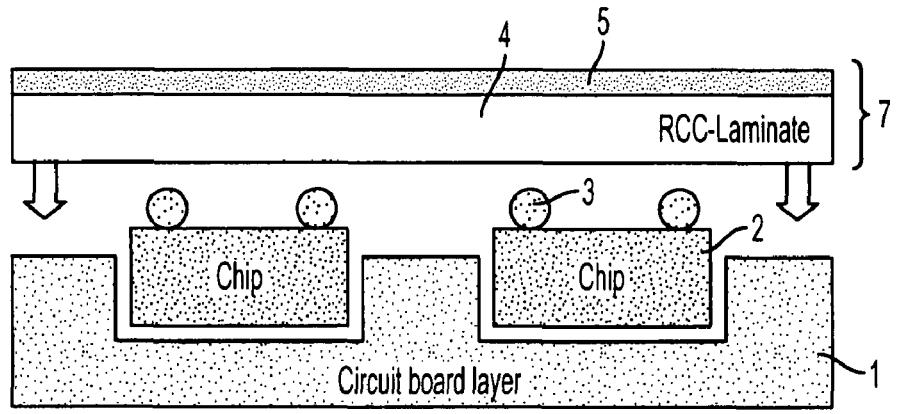
FIG. 5 depicts a cross-sectional view of a design according to a fifth embodiment of the invention.

A further embodiment of the present method is illustrated in the cross-sectional view of FIG. 5. In this embodiment, where semiconductor chips 2 have a greater thickness than the embodiments in FIGS. 1 to 3, circuit board layer 1 is provided with recesses in which semiconductor chips 2 are inserted. Before semiconductor chips 2 are glued into the circuit board layer 1, semiconductor chips 2 are provided with soldering bumps 3 on their contacts as in the previous examples. The connection to the copper foil 5 of an RCC laminate 7 is again carried on as previously described.

In the embodiments described above, the electrical connection between the contacts of semiconductor chips 2 and copper foil 5 is made using a combination of pressure and temperature to produce a soldered joint between the two. In the following three embodiments, however, the electrical connection can be achieved purely mechanically, i.e., without the use of temperature. In these embodiments, the electrical contacts of semiconductor chips 2 are provided with electrically conducting contact bumps 10, which taper upwards so that they can be forced into copper foil 5.

Figure 6:
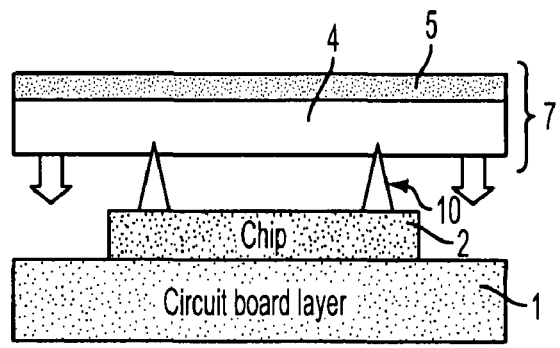
FIG. 6 depicts a cross-sectional view of a design according to a sixth embodiment of the invention.

FIG. 6 shows a cross-sectional view of a design according to an embodiment of the invention, in which the studded contact bumps 10 arranged on top of the contacts of the semiconductor chips 2 are drilled into copper foil 5 by the epoxy of RCC laminate 7, thereby making an electrical connection between the contacts of semiconductor ship 2 and copper foil 5. In this and the next two embodiments the material of the electrically conducting contact bumps 10 are sufficiently hard to be able to be pressed into copper foil 5. The use of a soldering material is not necessary in this embodiment.

Figure 7:
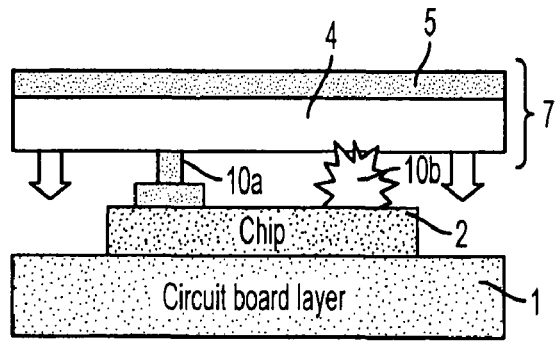
FIG. 7 depicts a cross-sectional view of a design according to a seventh embodiment of the invention.
Figure 8:
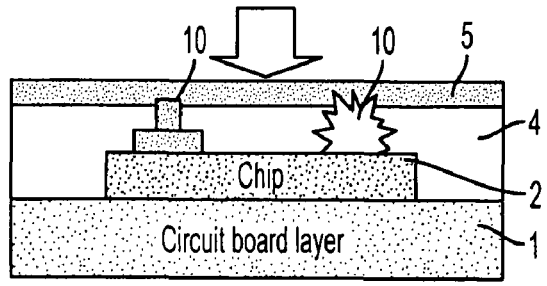
FIG. 8 depicts the result of the design method from FIG. 7.

FIG. 7 shows two examples of further possible designs of contact bumps 10 for establishing an electrical connection to copper foil 5. The left contact bump 10a shown in FIG. 7 has the shape of a so-called stud bump, while the right contact bump 10b has a multiplicity of small studs for penetrating the copper foil 5. Such a surface structure, represented in a highly schematized manner in the figure, may be achieved by, for example, inserting diamond particles in a metallic material for producing the contact bump 10. In an embodiment, this structure may be laminated as shown in FIG. 8. The penetration of contact bumps 10 in copper foil 5 is clearly seen in these two figures.

After the lamination and connection process, the copper foil 5 is structured on the surface in order to produce the corresponding circuit tracks. FIG. 9 shows an example of a buried semiconductor chip 2 on a circuit board layer 1 connected to the copper foil 5 via the soldering bumps 3. Also shown in FIG. 9 are the adhesive coat 11 between semiconductor chip 2 and circuit board layer 1, the electrical contact 12 of semiconductor chip 2, and the structuring of copper foil 5.

FIGS. 10a-10b show two light-microscopic cross-section views of a connection of the soldering mass of soldering bumps 3 of semiconductor chip 2 and copper foil 5 in a structure such as that shown in FIG. 9. Here, FIG. 10b shows a greater magnification than FIG. 10a. The soldered joint between contacts 12 and copper foil 5 can be clearly seen.

FIG. 11 shows diagrammatically an example of the electrical connection of studded contact bumps 10a over the buried semiconductor chip 2, which establish a push button connection between contacts 12 of semiconductor chip 2 and copper foil 5 of the RCC laminate 7. Here, the adhesive coat 11 between the chip 2 and the circuit board layer 1, as well as the electrical contacts 12 of the semiconductor chip 2 can be seen.

FIGS. 12a-12b again shows two light microscopic cross-sectional images of a buried contacted semiconductor chip 2, FIG. 12b showing a greater magnification than FIG. 12a. The electrical connection between contact faces 12 of semiconductor chip 2 and copper foil 5 can also be clearly seen in these two Figures.

While the invention has been illustrated and described in detail in the drawings and forgoing description, such illustration and description are to be considered illustrative or and the invention is not restricted or limited to the disclosed embodiments. The different embodiments described above and in the claims can also be combined. Other variations to the disclosed embodiments can be understood and effected by those skilled in the art in practicing the claimed invention, from a study of the drawings, the disclosure and the appended claims.

In the claims, the word "comprising" does not exclude other elements or steps, and the indefinite article "a" or "an" does not exclude a plurality. The mere fact that measures are recited in mutually different dependent claims does not indicate that a combination of these measures can not be used to advantage.

The invention claimed is:

1. A method of making an electrical connection with a microelectronic component arranged on or embedded within a surface of a circuit board layer, the microelectronic component having an electrical contact face accessible on a surface of the microelectronic component oriented away from the surface of the circuit board layer, the method comprising:
applying an electrically conducting bump to the electrical contact face of the microelectronic component; and
applying a laminate comprising a metal foil holding a coating of an insulating binder to the electrical contact face of the microelectronic component via the coating of the insulating binder under action of at least one of pressure or heat so that the electrically conducting bump penetrates the coating of the insulating binder to contact the metal foil so as to make the electrical connection between the metal foil and the electrical contact face without forming holes in the coating except those due to the bump penetration.

2. The method of claim 1, wherein the electrically conducting bump includes a solder that softens when heated, the method further comprising heating the insulating binder to soften the electrically conducting bump to initiate a soldered joint with the metal foil.

3. The method of claim 1, wherein the electrically conducting bump includes at least one of an upwardly tapering shape or a plurality of studs to penetrate the metal foil.

4. The method of claim 1, wherein the metal foil comprises a copper foil.

5. The method of claim 1, wherein the insulating binder comprises an RCC laminate coat.

6. The method of claim 1, further comprising printing the insulating binder over the entire bottom surface of the metal foil.

7. The method of claim 1, further comprising printing the insulating binder over the bottom surface of the metal foil in a structured manner such that a region of the metal foil where the electrically conducting bump is to be connected is uncovered by the insulating binder.

8. A method of making an electrical connection with a microelectronic component arranged on or embedded within a surface of a circuit board layer, the microelectronic component having an electrical contact face accessible on a surface of the microelectronic component oriented away from the surface of the circuit board layer, the method comprising:
applying an electrically conducting bump to the electrical contact face of the microelectronic component;
sequentially applying a coating of an insulating binder and a metal foil, wherein the coating of the insulating binder is first applied to the electrical contact face of the microelectronic component and then the metal foil is applied to the coating of the insulating binder on the electrical contact face under action of at least one of pressure or heat so that the electrically conducting bump being completely covered by the insulating binder penetrates the coating of the insulating binder to contact the separate metal foil so as to make the electrical connection between the separate metal foil and the electrical contact face without forming holes in the coating except those due to bump penetration.

9. The method of claim 1, wherein the microelectronic component includes at least one of a semiconductor chip or an SMD component.

10. A method of making an electrical connection with a microelectronic component arranged on or embedded within a substrate, the microelectronic component having an electrical contact face accessible on a surface of the microelectronic component oriented away from the surface of the substrate, the method comprising:
applying an electrically conducting bump to the electrical contact face of the microelectronic component; and
applying a laminate comprising a metal foil holding a coating of an insulating binder to the electrical contact face of the microelectronic component via the coating of the insulating binder under action of at least one of pressure or heat so that the electrically conducting bump penetrates the coating of the insulating binder to contact the metal foil so as to make the electrical connection between the metal foil and the electrical contact face without forming holes in the coating except those due to the bump penetration.

11. The method of claim 10, wherein the electrically conducting bump includes a solder that softens when heated, the method further comprising heating the insulating binder to soften the electrically conducting bump to initiate a soldered joint with the metal foil.

12. The method of claim 10, wherein the electrically conducting bump includes at least one of an upwardly tapering shape or a plurality of studs to penetrate the metal foil.

13. The method of claim 10, wherein the metal foil comprises a copper foil.

14. The method of claim 10, wherein the insulating binder comprises an RCC laminate coat.

15. The method of claim 10, further comprising printing the insulating binder over the entire bottom surface of the metal foil.

16. The method of claim 10, further comprising printing the insulating binder over the bottom surface of the metal foil in a structured manner such that a region of the metal foil where the electrically conducting bump is to be connected is uncovered by the insulating binder.

17. A method of making an electrical connection with a microelectronic component arranged on or embedded within a substrate, the microelectronic component having an electrical contact face accessible on a surface of the microelectronic component oriented away from the surface of the substrate, the method comprising:
applying an electrically conducting bump to the electrical contact face of the microelectronic component;
sequentially applying a coating of an insulating binder and a metal foil, wherein the coating of the insulating binder is first applied to the electrical contact face of the microelectronic component and then the metal foil is applied to the coating of the insulating binder on the electrical contact face under action of at least one of pressure or heat so that the electrically conducting bump being completely covered by the insulating binder penetrates the coating of the insulating binder to contact the separate metal foil so as to make the electrical connection between the separate metal foil and the electrical contact face without forming holes in the coating except those due to bump penetration.

18. The method of claim 10, wherein the microelectronic component includes at least one of a semiconductor chip or an SMD component.

19. The method of claim 10, wherein the substrate includes a wafer comprising the microelectronic component.

20. The method of claim 19, wherein the microelectronic component includes at least one of a semiconductor chip or an SMD component.

* * * * *